United States Patent
Black et al.

(10) Patent No.: US 10,122,081 B2
(45) Date of Patent: Nov. 6, 2018

(54) HAND GRIP SENSOR FOR EXTERNAL CHASSIS ANTENNA

(71) Applicant: GOOGLE TECHNOLOGY HOLDINGS LLC, Mountain View, CA (US)

(72) Inventors: Gregory R. Black, Vernon Hills, IL (US); Vijay L. Asrani, Round Lake, IL (US); Aaron L. Dietrich, Caledonia, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 0 days.

(21) Appl. No.: 14/280,760

(22) Filed: May 19, 2014

(65) Prior Publication Data

US 2015/0380812 A1 Dec. 31, 2015

Related U.S. Application Data (60) Provisional application No. 61/952,321, filed on Mar. 13, 2014.

(51) Int. Cl.
*H04W 88/02* (2009.01)
*H01Q 1/50* (2006.01)
(Continued)

(52) U.S. Cl.
CPC ........... *H01Q 1/50* (2013.01); *G01R 27/2605* (2013.01); *H01Q 1/243* (2013.01); *H01Q 1/245* (2013.01);
(Continued)

(58) Field of Classification Search
CPC .......... H01Q 1/243; H01Q 1/50; H01Q 1/245; H01Q 5/335; H01Q 1/48; H01Q 7/005;
(Continued)

(56) References Cited

U.S. PATENT DOCUMENTS 5,663,633 A * 9/1997 Kahn ................... H03K 17/962
323/211
7,180,467 B2 * 2/2007 Fabrega-Sanchez ........................
G01R 27/2694
343/861

(Continued)

FOREIGN PATENT DOCUMENTS

CN 102544753 A 7/2012
CN 103138042 A 6/2013
(Continued)

OTHER PUBLICATIONS

US 8,427,376, 04/2013, Schlub et al. (withdrawn)
(Continued)

*Primary Examiner* — Dieu H Duong
*Assistant Examiner* — Bamidele A Jegede
(74) *Attorney, Agent, or Firm* — Fish & Richardson P.C.

(57) ABSTRACT

A method and system for detecting whether the position of a user's hand gripping a mobile communication device chassis affects an external antenna is provided. A sectioned metal band about a periphery of a mobile communication device has a radiating antenna in at least one metal section. The radiating antenna section is bounded on both sides by electrically floating metal sections. Each of the electrically floating metal sections is bounded on the side distal from the antenna section by a ground metal section. Each metal section separated from an adjacent metal section by an insulating gap. Embodiments measure a differential capacitance between the antenna section and the floating metal section and measure a single and capacitance between the floating metal section and the grounded section to determine whether a user's hand is bridging one or more of the insulating gaps.

16 Claims, 5 Drawing Sheets (51) Int. Cl.
  *H01Q 1/24* (2006.01)
  *G01R 27/26* (2006.01)
  *H01Q 1/48* (2006.01)
  *H01Q 7/00* (2006.01)
  *H01Q 5/335* (2015.01)

(52) U.S. Cl.
  CPC .............. *H01Q 1/48* (2013.01); *H01Q 5/335* (2015.01); *H01Q 7/005* (2013.01); *H04W 88/02* (2013.01)

(58) Field of Classification Search
  CPC .............. H04B 1/0458; G01R 27/2694; G01R 27/2605; H04W 88/02
  USPC ........... 343/702, 745, 861; 455/129, 566, 77
  See application file for complete search history.

(56) References Cited

U.S. PATENT DOCUMENTS

| | | | |
|---|---|---|---|
| 7,777,501 B2 | 8/2010 | Reynolds et al. | |
| 8,432,322 B2 | 4/2013 | Amm et al. | |
| 8,466,839 B2 | 6/2013 | Schlub et al. | |
| 8,571,472 B2* | 10/2013 | Lin ...................... | G06F 1/1684 455/129 |
| 8,576,177 B2 | 11/2013 | Westerman et al. | |
| 8,577,289 B2 | 11/2013 | Schlub et al. | |
| 8,581,789 B2 | 11/2013 | Desclos et al. | |
| 2004/0263411 A1* | 12/2004 | Fabrega-Sanchez ........................ | G01R 27/2694 343/861 |
| 2007/0091006 A1* | 4/2007 | Thober ................. | H01Q 7/005 343/745 |
| 2008/0006454 A1 | 1/2008 | Hotelling | |
| 2011/0012793 A1* | 1/2011 | Amm ..................... | H01Q 1/243 343/702 |
| 2012/0050122 A1* | 3/2012 | Wu ...................... | H04B 1/0458 343/745 |
| 2012/0112970 A1* | 5/2012 | Caballero ............. | H01Q 1/243 343/702 |
| 2012/0164962 A1* | 6/2012 | Lin ....................... | G06F 1/1684 455/127.1 |
| 2012/0329524 A1* | 12/2012 | Kent ..................... | G06F 3/044 455/566 |
| 2013/0050046 A1* | 2/2013 | Jarvis .................... | H01Q 1/243 343/852 |
| 2013/0135157 A1 | 5/2013 | Tsou et al. | |
| 2013/0217342 A1* | 8/2013 | Abdul-Gaffoor ...... | H01Q 1/243 455/77 |
| 2013/0321325 A1 | 12/2013 | Jo et al. | |
| 2014/0071008 A1 | 3/2014 | Desclos et al. | |
| 2014/0111388 A1 | 4/2014 | Di Nallo et al. | |
| 2014/0155000 A1* | 6/2014 | Erkens .................. | H01Q 1/245 455/73 |

FOREIGN PATENT DOCUMENTS

| | | |
|---|---|---|
| TW | 201210190 A | 3/2012 |
| WO | WO 2012061394 | 5/2012 |
| WO | WO 2012177369 | 12/2012 |

OTHER PUBLICATIONS

PCT Search Report and Written Opinion issued in PCT/US2015/019220 dated Jun. 3, 2015.

Huttunen, et al., "Capacitive Sensing of Antenna Loading With an R-C Voltage Divider in a Tunable Antenna", IEEE Sensors Journal, IEEE Service Center, New York, NY, US, vol. 13, No. 2, Feb. 1, 2013, pp. 849-853.

Office Action issued in Chinese Application No. 201580013760.9, dated Apr. 19, 2018, 22 pages (with English Translation).

Office Action issued in European Application No. 15710395.3, dated Apr. 24, 2018, 7 pages.

* cited by examiner

HAND GRIP SENSOR FOR EXTERNAL CHASSIS ANTENNA

TECHNICAL FIELD

The following disclosure relates to a sectioned metal band about a perimeter of a mobile communication device. More particularly, the following disclosure relates to a portable communication device having a sectioned metal band about its perimeter wherein at least one section is an antenna, another section is grounded and yet another section is isolated from both the antenna section and ground so that impedance loading of the antenna caused, for example, by a user touching and bridging gaps between all three sections simultaneously, is sensed and compensated for in order improve the efficiency of the antenna.

BACKGROUND

Portable communication devices, such as mobile phones, personal digital assistants (PDAs) and tablets have become extremely popular and for many users are now considered indispensable.

One of the most important components of portable communication devices (hereinafter referred to as "UE"s) are their antennas, which are configured to radiate and receive electromagnetic waves so as to transmit and exchange wireless information signals between the UE and other locations. Such antennas must be designed to work with multiple frequency bands such as those used in present day wireless communication networks. Wireless communication device users continue to demand increasingly thinner, lighter and miniaturized devices. Such demands place additional physical limitations on the antennas used in portable wireless communication devices. As a result, multi-band antenna design for mobile communication devices continues to become more complex.

The housings of portable communication devices or user equipment (UE) may accommodate one or more antennas that support wireless communications. A UE may use long-range wireless communication systems such as cellular telephone systems, to send and receive communications. Such cellular or other long-range wireless communication systems may include, the Global System for Mobile Communications (GSM) telephone bands, Enhanced Data rates for GSM Evolution (EDGE); General Packet Radio System (GPRS); CDMA, such as IS-95; CDMA2000; WCDMA or Universal Mobile Telecommunications System (UMTS); Fourth Generation Long Term Evolution (LTE); other wide area network communication systems; PrivateMobile Radio (PMR); Worldwide Interoperability for Microwave Access (WIMAX); WLAN; other 3G or 4G networks; or the like. UEs may also use short-range wireless communication protocols to support communications with nearby devices. Such short rang protocols may include Wi-Fi (IEEE 802.11) and Bluetooth protocols.

The positioning and placement of antennas in UEs having smaller and thinner housings present additional design challenges. Handheld communication devices have largely abandoned antenna designs that have an antenna projecting outward from the housing. Mobile communication device housings are now routinely designed with internal antenna elements. However, when antennas are positioned within or along an edge of the device housing, the presence of a user's hand can degrade antenna performance. Regardless, antennas are routinely located along an inner edge of the device housing despite the increased likelihood of these detrimental effects.

Additionally, when an antenna is included as part of an exterior surface of a UE chassis, the touch of a user's hand may also establish a low impedance bridge between the exterior antenna and a grounded exterior section of the UE chassis. Such a low impedance bridge can be detrimental to the efficiency and operation of the UE's ability to transmit and received radio frequency (RF) signals.

BRIEF DESCRIPTION OF THE DRAWINGS

For a more complete understanding, reference is now made to the following description taken in conjunction with the accompanying Drawings in which.

DETAILED DESCRIPTION

In the following detailed description various embodiments are provided and described in sufficient detail to enable those skilled in the art to practice this disclosure. It is to be understood that other embodiments may be utilized and that logical, architectural, programmatic, mechanical, electrical and other changes may be made without departing from the spirit or scope of the present disclosure. The following detailed description is therefore not to be taken in a limiting sense and the scope of the present disclosure is defined by the appended claims and equivalents thereof.

Within the descriptions of the various figures, similar elements may be provided similar names and reference numerals as to those of previous figures. The specific numerals assigned to the elements are provided solely to aid in the description and are not meant to imply any limitations (structural, functional or otherwise) on the described element.

It is understood that the use of specific component, device and/or parameter names, such as those of executing utility, logic, or firmware described herein are for example only and not meant to imply any limitations on the described embodiments. The embodiments may thus be described with different nomenclature or terminology or acronyms utilized to describe the components, devices and parameters herein, without limitation references to any specific protocol or proprietary name in describing one or more elements, features or concepts of the embodiments are provided solely as examples of one implementation, and such references do not limit the extension of the claimed embodiments to embodiments in which a different element, feature or concept name may be utilized. Thus, each term utilized herein is to be given its broadest interpretation based on the context in which that term is utilized.

As further described below, implementation of the functional features of the disclosure described are provided within processing devices/structures and can involve use of a combination of hardware, firmware, as well as several software-level constructs (e.g., program code) that are executed by a processing device to provide a specific utility for the device presented. Figures illustrate both hardware components and software/logic components within embodiments of a communication device architecture.

The illustrated embodiments provide a method and communication device that implements an antenna and capacitive sensing system associated with a slotted metal bezel about a periphery of the front and/or backside of a mobile communication device (UE). The bezel or band may be a slotted or gapped metal band having plurality of metal segments or sections separated by small gaps. The small gaps configured have a width that is large enough so that the metal segments on either side of each gap do not contact each other. The small gaps may have a width of or separate the two adjacent metal segments by about 0.1 mm to about 1 cm. Various ones of the metal segments are configured to operate as an integrated antenna, while other segments operate as parasitic capacitive elements and ground elements used in conjunction to provide antenna impedance measurements and adjustment. The bezel may include cosmetic features that enhance the look of the mobile communication device. Embodiments of the capacitive sensing and touch sensing system takes a minimal amount of space within the UE and, among other things, helps mitigate detuning of one or more of the UE's antenna due to the touching of a user's hand to one or more adjacent antenna segments and determining whether one or more gaps between segments have been bridged by the touch. Sensing the capacitance and/or impedance associated with a transmitting antenna helps with transmit power reduction due to a mismatched impedance between the transceiver and the antenna. According to one or more embodiments, the capacitance sensors provide a UE the ability to carry out antenna tuning, which compensates for antenna detuning caused by, for example a capacitive touch of a user with the antenna element and one or more adjacent metal elements such that the antenna section is bridged by a user's finger, hand or touch to another metal section and/or ground.

In a mobile communication device having an external antenna as part of a perimeter band or edge about the mobile communication device, the external antenna can be dialectrically loaded by having contact with a user's hand. That is, when a user's hand is near or touching the external antenna it affects the dielectric properties between the antenna and ground. The impedance, as seen by the transmitter that is providing a signal to the antenna becomes more capacitive. This problem is most acute when an antenna is on the outside of a mobile communication device and exposed to being touched directly by a user during radiofrequency (RF) communication. Actual contact between, for example, a user's hand and the metal of an outside or exterior UE antenna has more of an impedance changing effect between the antenna and the transceiver then when a user's hand is merely near or proximate to the antenna.

An overall problem is that an impedance change of the antenna, as seen by the transceiver inside a UE, affects the power transfer of the transmitted or received signals between the receiver and the antenna. When a user's hand touches an antenna it affects the impedance of the antenna. Thus, a previously matched impedance between the transceiver and antenna will no longer be matched. Additional power is required to transmit or receive communications over the antenna when the impedance between the transceiver end and antenna is mismatched. Additionally, when an exterior UE antenna is bridged by an impedance to ground, the efficiency of the antenna is greatly reduced as the resistive aspect of the impedance decreases and the capacitive aspect of the impedance increases.

Figure 1:
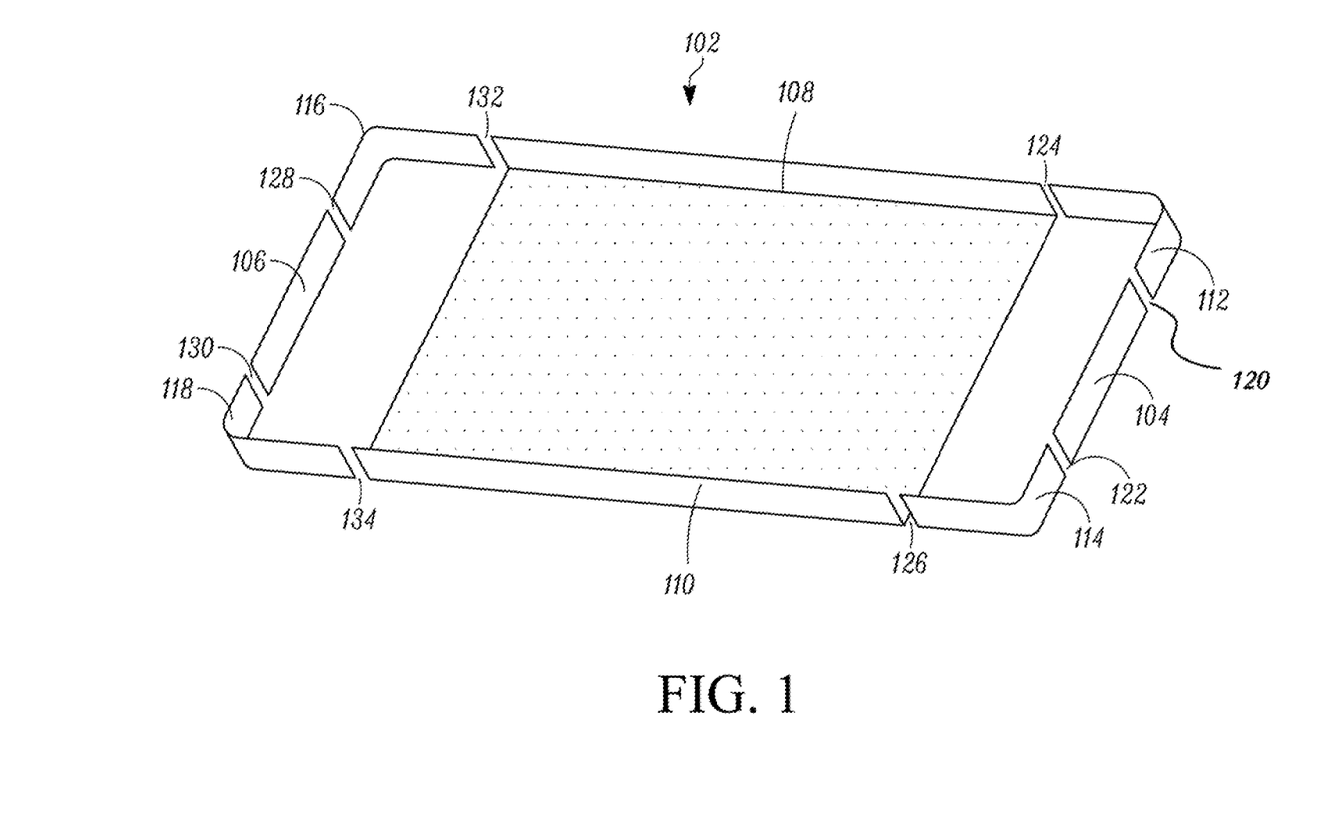
FIG. 1 illustrates a mobile communication device chassis having a sectioned metal band about a perimeter edge of the mobile communication device.

Referring to FIG. 1, a mobile communication device chassis 100 having a sectioned metal band 102 about a perimeter edge of the mobile communication device is shown. The inner contents of the mobile communication device (UE) are not specifically shown for clarity. The sectioned metal band 102 has two antenna sections, being a top antenna section 104 and a bottom antenna section 106. There are two metal grounded sections, being a first grounded section 108 and a second grounded section 110. Four metal corner sections, being first, second, third and fourth corner sections (112, 114, 116, 118) are provided to reduce the capacitive coupling between the antenna sections 104, 106 and the electrical ground sections 108, 110 by providing distance between the antenna sections and ground. The reduction of coupling (i.e., decoupling) between the antennas 104, 106 and the grounded sections 108, 110 improves the antenna efficiency. The four metal sections (112, 114, 116, and 118) may be referred to as parasitic sections, electrically floating sections and/or floating sections. The four metal sections (112, 114, 116, 118) are each positioned as a part of the metal band 102 between an antenna section (104 and 106) and a ground section (108 and 110).

In various embodiments, the sectioned metal band 102 comprises insulative or high impedance gaps between the various metal sections of the sectioned metal band 102. For example, the top antenna 104 is defined between a first gap 120 and a second gap 122. The first corner section 112 is adjacent to and separated from a first side of the top antenna 104 by the first gap 120. The first grounded section 108 is adjacent to and separated from the first corner section 112 by a third gap 124. The second corner section 114 is adjacent to and separated from a second side of the top antenna 104 by the second gap 122. The second grounded section 110 is adjacent to and separated from the second corner section 114 by a fourth gap 126.

The bottom antenna section 106 is positioned between the fifth gap 128 and the sixth 130. The third corner section 116 is adjacent to and separated from a first side of the bottom antenna 106 by the fifth gap 128. The first grounded section 108 is adjacent to and separated from the third corner section 116 by a seventh gap 132. The fourth corner section 118 is adjacent to and separated from a second side of the bottom antenna 106 by a sixth gap 130. The second grounded section 110 is adjacent to and separated from the fourth corner section 118 by an eighth gap 134. Thus, each metal section of the sectioned metal band 102 is defined and separated from each of the other metal sections by gaps. In other words, each one of the plurality of conductive metal sections is interposed between the plurality of gaps such that two gaps define the ends of each conductive section in the slotted or sectioned metal band 102. It is understood that the gaps may be made of an insulative polymer, ceramic, plastic, epoxy, rubber, glass or other substantially equivalent insulative material. In some embodiments, the gap material may be an extension of the mobile communication device's housing material, while in other embodiments, the gap material may be incorporated into or as part of the structure of the sectioned metal band 102 or bezel.

The top and bottom antenna 104, 106 are both driven sections, which comprise radiating antennas. In some embodiments the top antenna 104 is a diversity antenna for receiving only, while the bottom antenna 106 is for both transmitting and receiving radio communication signals. While in other embodiments, both antennas are configured to transmit or receive RF signals.

The corner sections 112, 114, 116 and 118 are provided to reduce capacitive coupling between the driven top and bottom antenna sections 104, 106 and the electrical ground sections 108, 110. Since any electrical coupling between the antenna sections and the ground sections reduces the efficiency of each antenna respectively, then any improvement that reduces or helps reduce coupling or the potential for coupling between a driven antenna and the ground sections improves the overall transceiving operation of an embodiment.

Additionally, the metal corner sections 112, 114, 116 and 118 do not function as antenna. As mentioned previously, the corner sections 112, 114, 116 and 118 are provided to decrease the probability that a user's finger or hand, while holding the UE, will couple or complete a circuit between a driven antenna, for example top antenna 104, and one or more of the ground sections 108, 110. This is important because when a user's finger or hand bridges or completes the circuit between a driven antenna and a ground section, there can be a strong capacitive coupling between the driven antenna section and ground thereby requiring retuning of an impedance matching circuit connected between the antenna and a transceiver.

In various embodiments and as shown in FIG. 1, the metal sections or corner sections 112, 114, 116 and 118 are positioned between the antenna sections 104, 106 and the ground sections 108, 110. These corner sections 112, 114, 116 and 118 are not electrically connected to the electrical ground of the UE. Instead these corner or metal sections have what is referred to as a floating ground. As such, if the user's finger or hand bridges, for example, the first gap 120 between the top antenna 104 and the first corner 112 there will not be a strong coupling between the top antenna 104 and ground because the first corner section 112 is isolated from the first grounded section 108 by the third gap 124.

However, if a user's finger or hand were to bridge both the first gap 120 and the third gap 124, a strong capacitive coupling between the driven top antenna 104 and electrical ground of the UE via the first ground section 108 is most likely created. Embodiments provide measures to improve the efficiency of the, for example, first antenna 104 when a user's fingers bridge both the first and third gaps 120, 124 about a floating ground section by recognizing that the gaps have been bridged and further by retuning an antenna matching circuit or by switching the transceiver to use a another antenna of the UE, such as the bottom antenna 106 or an internal antenna (not specifically shown). Embodiments provide a device, system and method that detect a singular or the multiple simultaneous bridging of one or more gaps on the sectioned metal band 102. Embodiments further are configured to respond to the detected bridging of one or more gaps with an appropriate retuning of an antenna matching circuit or by switching to the other antenna.

Figure 2:
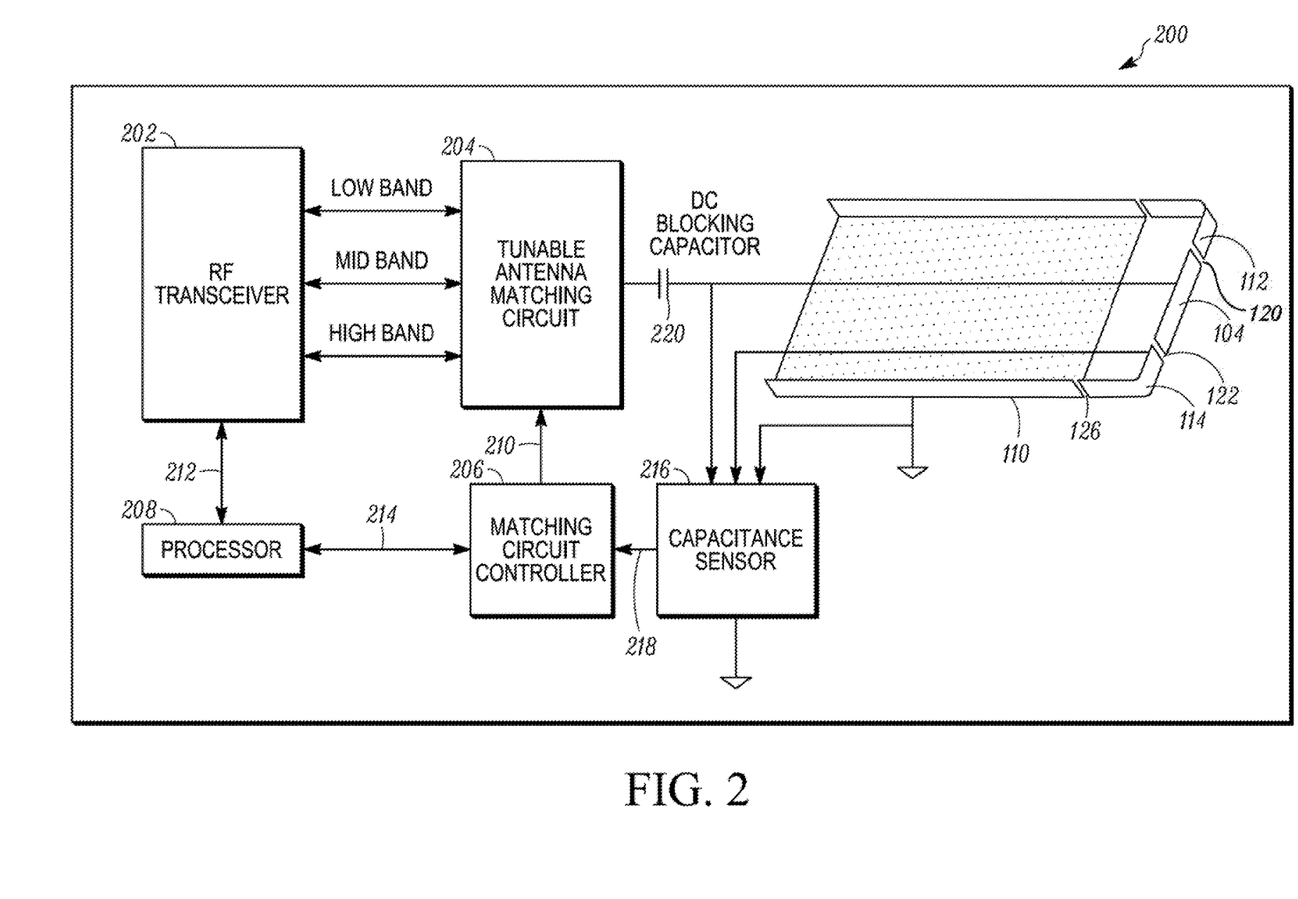
FIG. 2 is a block diagram of mobile communication device circuitry connected to metal sections about an exterior perimeter of the mobile communication device.

Referring now to FIG. 2, a block diagram of UE circuitry connected to various metal sections about a perimeter edge of the UE device is shown. In order to simplify the description, FIG. 2 discusses one antenna, one corner section and one ground section, but it is understood that this configuration and discussion may be relevant for other antenna sections of the sectioned metal band 102 about the UE 200.

In this embodiment an RF transceiver 202 is instructed by a processor 208 to either transmit or receive wireless communication signals via the first antenna 104. The RF transceiver 202 is connected to a tunable antenna matching circuit 204, which is tuned to match the impedance between the RF transceiver 202 and the first antenna 104. The tunable antenna matching circuit 204 receives a tuning input signal 210 from a matching circuit controller 206. The tuning input signal 210 may be either a digital or analog signal. The tuning input signal 210 is provided to the tunable antenna matching circuit 204, which uses the signal to adjust the variable impedance circuits within the tunable antenna matching circuit 204.

A processor 208 is configured to control the transmission and reception of wireless communication signals on the UE. The processor 208 provides RF transceiver control signals 212 to the RF transceiver 202 and matching circuit controller signals 214 to the matching circuit controller 206. The matching circuit controller 206 uses the matching circuit controller signals 214 to tune the tunable antenna matching circuit 204 such that the impedance between the RF transceiver 202 and the antenna 104 are appropriately matched for the low, mid or high band signals that may be transmitted or received by the RF transceiver 202.

Under circumstances where the user's hand or fingers bridge the gap 122 between both the antenna 104 and the corner section 114, embodiments provide the ability to sense and measure a change in impedance loading of the antenna section 104 and further to retune or reconfigure the tunable antenna matching circuit 204 in order to reestablish a match the impedance between the transceiver 202 and the antenna section 104 for the frequency band being transmitted or received on the UE.

Embodiments are also configured to detect a simultaneous bridging of the second gap 122 and forth gap 126 by incorporating both a differential capacitance sensor 215 connected between the antenna 104 and the corner section 114, and a single ended capacitance sensor 217 connected between the corner section 114 and ground (or in some embodiments the grounded metal section 110). Both the differential capacitance sensor 215 and the single ended capacitance sensor 217 are part of the capacitance sensor block 216 and will be discussed in more detail in FIG. 3. In various embodiments, when the differential capacitance sensor measures a differential capacitance that exceeds a predetermined differential threshold capacitance, the capacitance sensor block 216 will determine that the gap 122 between the antenna and a corner section (e.g., the first antenna 104 and second corner section 114) is being bridged by a user's finger or hand. Additionally, when a single ended capacitance sensor measures a capacitance between the corner section and ground that exceeds a predetermined threshold capacitance, the capacitance sensor block 216 will determine that the gap 126 between the corner section and the ground section (e.g., the second corner section 114 and the second ground section 110) is being bridged by a user's finger. When both the measured differential capacitance exceeds the predetermined differential threshold capacitance and the capacitance between the same corner section and ground exceeds the predetermined threshold capacitance, then the capacitance sensor block 216 will determine that both of the gaps 122 and 126 are being simultaneously bridged by a user's finger or hand. When both of the gaps 122 and 126 are determined to be bridged, the capacitance sensor provides a capacitance sense signal 218 to the matching controller circuit 206. In some embodiments the capacitance sense signal indicates that both the gaps 122, 126 defining the metal corner piece 114 are being bridged. In other embodiments, the capacitance sense signal further includes an indication of the measured differential capacitance and the measured capacitance between the corner section and ground.

The matching circuit controller 206 uses the capacitance sense signal 218 to create and provide a tuning input signal 210 that can be used to reconfigure the tunable antenna impedance matching circuit 204. Reconfiguring the impedance matching circuit 204 is done to rematch the transmit or receive impedance between the antenna 104 and the RF transceiver while the determined gaps are being bridged.

In various embodiments, when the combination of the differential capacitance and the measured capacitance for a one of the metal corner sections both exceed their respective predetermined threshold values by more than a predetermined total capacitance, the matching circuit controller 206 may provide an antenna switch signal via connection 214 to the processor 208. The switch signal may indicate to the processor 208 that the RF transceiver 202 should connect to a different antenna in order to transmit or receive RF communications more efficiently.

Also, in various embodiments in order for the capacitance sensor 216 to operate efficiently, an antenna should not have a DC signal path to ground. To eliminate a DC signal path to ground a DC blocking capacitor 220 is connected in series between the tunable antenna matching circuit 204 and the antenna 104. The capacitance sensor 216 is connected to the antenna 104 on the antenna side of the DC blocking capacitor 220.

In prior art configurations, although ideally the DC blocking capacitor would work best if it had a very large value, the designs that used a DC blocking capacitor between their antenna and an impedance matching circuit where limited to using a DC blocking capacitor having a value of less than about 15 pF. The limitation to less than about 15 pF was due to the DC blocking capacitor also added to the total capacitance of the prior capacitance sensor circuit which used only a single ended capacitance sense between the active antenna and ground.

Conversely, in embodiments presented herein, the DC blocking capacitor 220 can be from about 15 pF to about 1000 pF without adversely affecting the capacitance sensor block. The reason for this is that embodiments perform a differential capacitance measurement between the active antenna 104 and the corner section 114. When performing a differential capacitance measurement between the antenna and the corner section, it does not matter whether or not the antenna is DC coupled to ground. Additionally, the DC blocking capacitor does not add with the differential capacitance measurement. Thus the DC blocking capacitor can be of a larger capacitance of between 15 pF and about 1000 pF without adversely affecting the differential capacitance portion of the capacitance sensor circuit.

An additional advantage of various embodiments is that by performing a first differential capacitive measurement between, for example, the first antenna 104 and in the first corner section 112 and a second differential capacitive measurement between the first antenna 104 and the second corner section 114, it can be determined which side of the first antenna 104 is being bridged.

Figure 3:
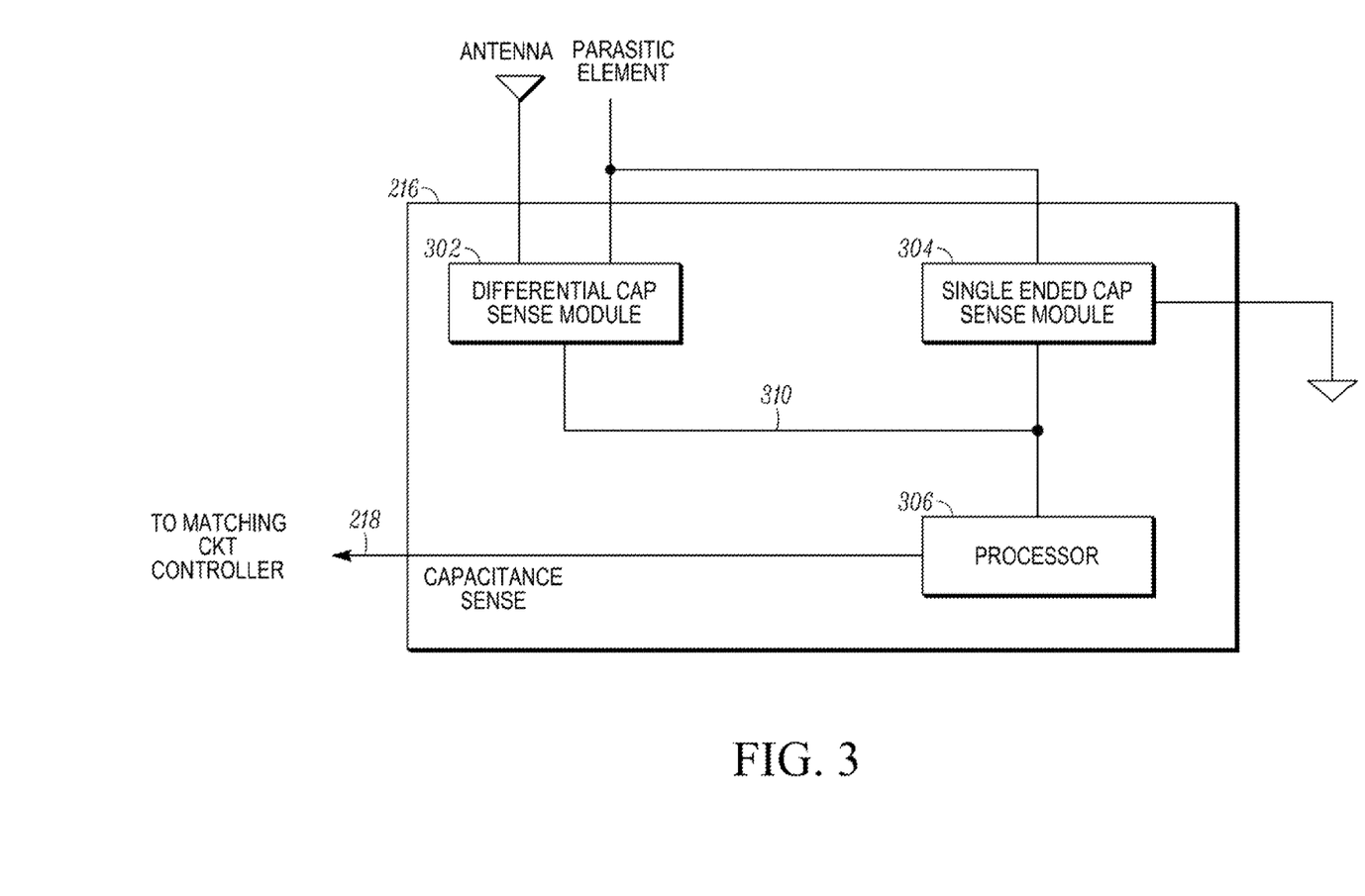
FIG. 3 is a block diagram of one embodiment of a capacitance sensor circuit.

FIG. 3 depicts a block diagram of one variation of the capacitance sensor block 216 that is configured to measure the differential capacitance between the corner section and antenna as well as a single ended capacitance between a corner section and ground. The capacitance sensor block 216 includes a differential capacitance sense block 302 that has inputs that connect to both an active antenna and a corner section (i.e., parasitic capacitive element). There is a single ended capacitance sense block 304, which has inputs that connect to both the parasitic capacitive element and to ground. The differential capacitance sense module 302 is configured to measure the difference in capacitance between the antenna section and the corner section. In some embodiments, the differential capacitance is measured by the differential capacitance sense module 302 by injecting a predetermined frequency signal onto the parasitic element and monitoring receipt of the signal at the antenna or vis-à-vis to determine capacitance shifts due to the gap there between being bridged or not bridged. Single ended capacitance sense module 304 measures the capacitance between the corner section (the parasitic element) and an electrical ground of the UE. The single ended capacitance sensor 304 is used to determine whether a user's finger is bridging, for example, the third or fourth gap 124, 126 between the respective first and second metal corner sections 112, 114 in the first and second ground sections 108, 110. The single ended capacitance sense module 304 measures the capacitance from the relevant corner section to ground. The combination of the measured differential capacitance across a gap on one side of the antenna (for example, the first gap 120) plus the single ended capacitance from the respective corner sections (for example, the first corner section 112) to ground, which is equivalent to being across the third gap 124, provides a total capacitance from one side of the first antenna 104 to ground. The total capacitance can then be provided via the capacitance sense signal to the matching circuit controller 206. The matching circuit controller 206 calculates the matching impedance needed between the RF transceiver and the antenna. The matching circuit controller 206 then provides a tuning input signal 210 in either a digital or analog format to the tunable antenna matching circuit 204 to adjust and closely match the impedance of the antenna and transceiver for the transmission or reception frequency band that is being or will be used by the UE.

It should be understood that in various embodiments the differential capacitance sense module 302 and the single ended capacitance sense module 304 may be performed by software modules, hardware or a combination of both. The capacitance sensor block 216 includes a processor 306, which is configured to control and operate via a signal bus 310 both the differential capacitance sense module 302 and the single ended capacitance sense module 304.

Referring back to FIG. 2, the main processor 208 provides the matching circuit controller signal 214 to the matching circuit controller 206. The matching circuit controller signal 214 may include impedance adjustment data or indicate the frequency band that the transceiver 202 is using so that the matching circuit controller 206 can adjust the tunable antenna matching circuit 204 accordingly.

The processor 306 in the capacitance sensor block 216 provides the capacitance sense signal 218 to the matching circuit controller 206. The capacitance sense signal 218 is indicative of whether the first, second, third and/or fourth gaps 120, 122, 124, 126 have been bridged as well as an indication of the impedance between the antenna and ground due to any bridging or non-bridging of the gaps proximate to or near the first antenna 104.

Figure 4:
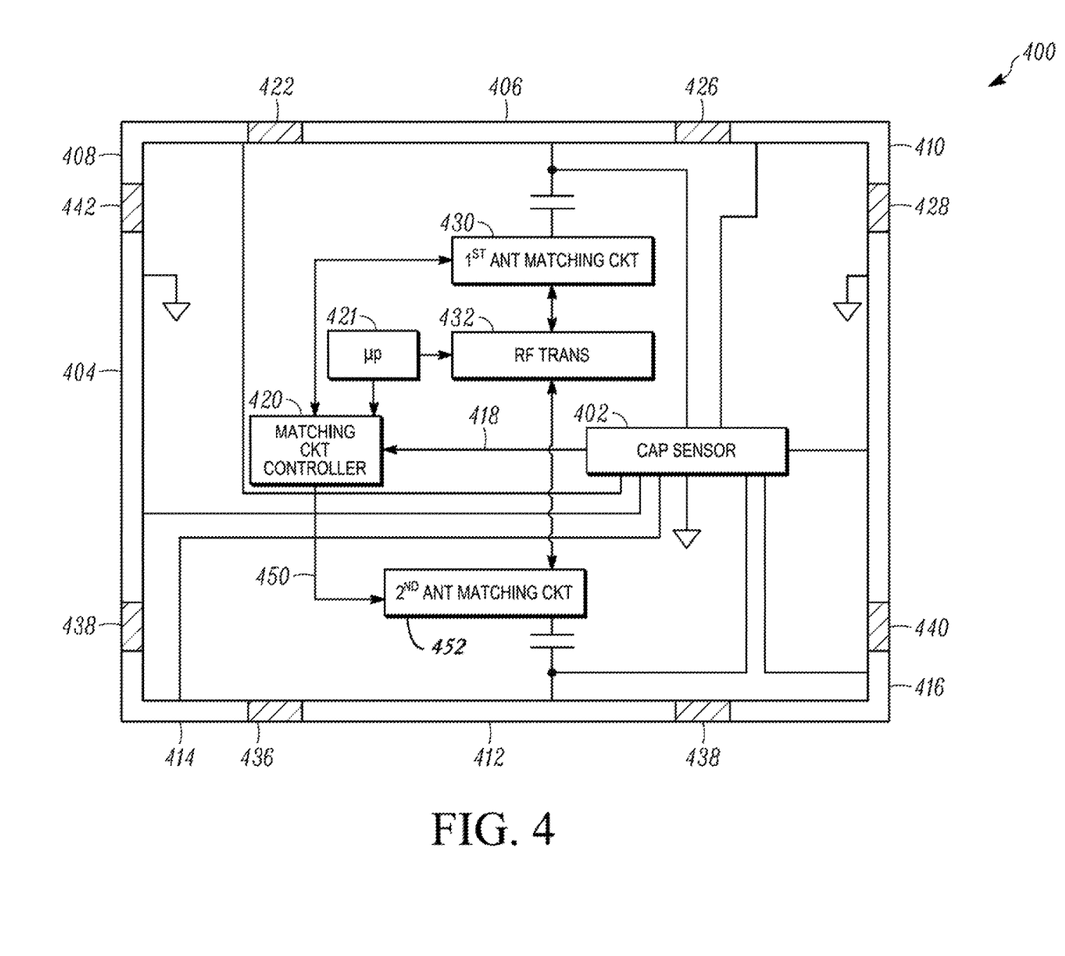
FIG. 4 is a block diagram of another embodiment of mobile communication circuitry connected to metal sections about a perimeter of a mobile communication device.

FIG. 4 depicts a block diagram of a UE 400 incorporating a capacitance sensor module 402 in accordance with another embodiment. Here a single capacitance sensor module 402 is connected to various metal sections of the sectioned metal band 404, which extends about a perimeter of the UE 400. The capacitance sensor module 402 determines the differential capacitance between the top antenna 406 and its two adjacent metal sections being the first corner section 408 and the second corner section 410. Additionally, the capacitance sensor module 402 determines the single ended capacitance between the first and second corner sections 408, 410 and ground. For the bottom antenna 412, the capacitance sensor module 402 measures the differential capacitance between the bottom antenna 412 and it's two adjacent metal sections being the third corner section 414 and the fourth corner section 416. Additionally, the capacitance sensor module 402 determines the single ended capacitance between the third and fourth corner sections 414, 416 and ground.

The capacitance sensor module 402 determines whether a differential capacitance between the top antenna 406 and the first corner section 408 exceeds a first threshold and whether a single ended capacitance between the first corner section 408 and ground exceeds a second threshold. If both the first and second thresholds are exceeded then the capacitance sensor module 402 determines that the first gap 422 and third gap 442 are being bridged by, for example, a user's finger or hand. Similarly the capacitance sensor module 402 determines whether a differential capacitance between the top antenna 406 and the second corner section 410 exceeds a third threshold and whether a single ended capacitance between the second corner 410 and ground exceeds a fourth threshold. If both the third and fourth thresholds are exceeded then the capacitance sensor module 402 determines that the second gap 426 and the fourth gap 428 are being bridged by, for example, the user's finger or hand. The capacitance sensor module 402 provides a capacitance sense signal 418 to the matching circuit controller 420 indicating that the first and third gaps 422, 424 and/or the second and fourth gaps 426, 428 are being bridged. The capacitance sense signal may also include an indication of the total sensed capacitance between the first and third gaps 422, 424 (i.e., between the top antenna 406 and ground) so that the matching controller circuit 420 can provide a tuning input signal to reconfigure the first antenna matching circuit 430 to account for the bridging of the first and third gaps 422, 424 and match the antenna impedance of the top antenna 406 with the RF transceiver 432.

Similarly, the capacitance sensor module 402 determines whether a differential capacitance between the bottom antenna 412 and the third corner section 414 exceeds a fifth threshold and/or whether a single ended capacitance between the third corner section 414 and ground exceeds a sixth threshold. If both the fifth and sixth thresholds are exceeded then the capacitance sensor module 402 determines that the fifth gap 436 and seventh gap 438 are being bridged by, for example, a user's finger or hand. In various embodiments, the same capacitance sensor module 402 also determines whether a differential capacitance between the bottom antenna 412 and the fourth corner section 416 exceeds a seventh threshold and/or whether a single ended capacitance between the fourth corner section 416 and ground exceeded eighth threshold. If both the seventh and the eighth thresholds are exceeded then the capacitance sensor module 402 determines that the sixth 438 and the eighth gap 440 are being bridged.

If, for example, the capacitance sensor module 402 determines that the fifth gap 436 and seventh gap 438 are being bridged, then the capacitance sensor module 402 provides a capacitance sense signal 418 to the matching circuit controller 420 indicating that the fifth and seventh gaps 436, 438 are being bridged. The capacitance sense signal 418 may include an indication as to which gaps are being bridged and the total capacitance sensed between the bottom antenna and ground caused by the bridging of the gap(s) between the bottom antenna 412 and ground. The matching controller circuit 420 uses the capacitance sense signal 418 to determine and provide a tuning input signal 450 to the second antenna matching circuit 452 in order to reconfigure the second antenna matching circuit 452 to closely impedance match the bottom antenna 412 with the RF transceiver 432.

Figure 5:
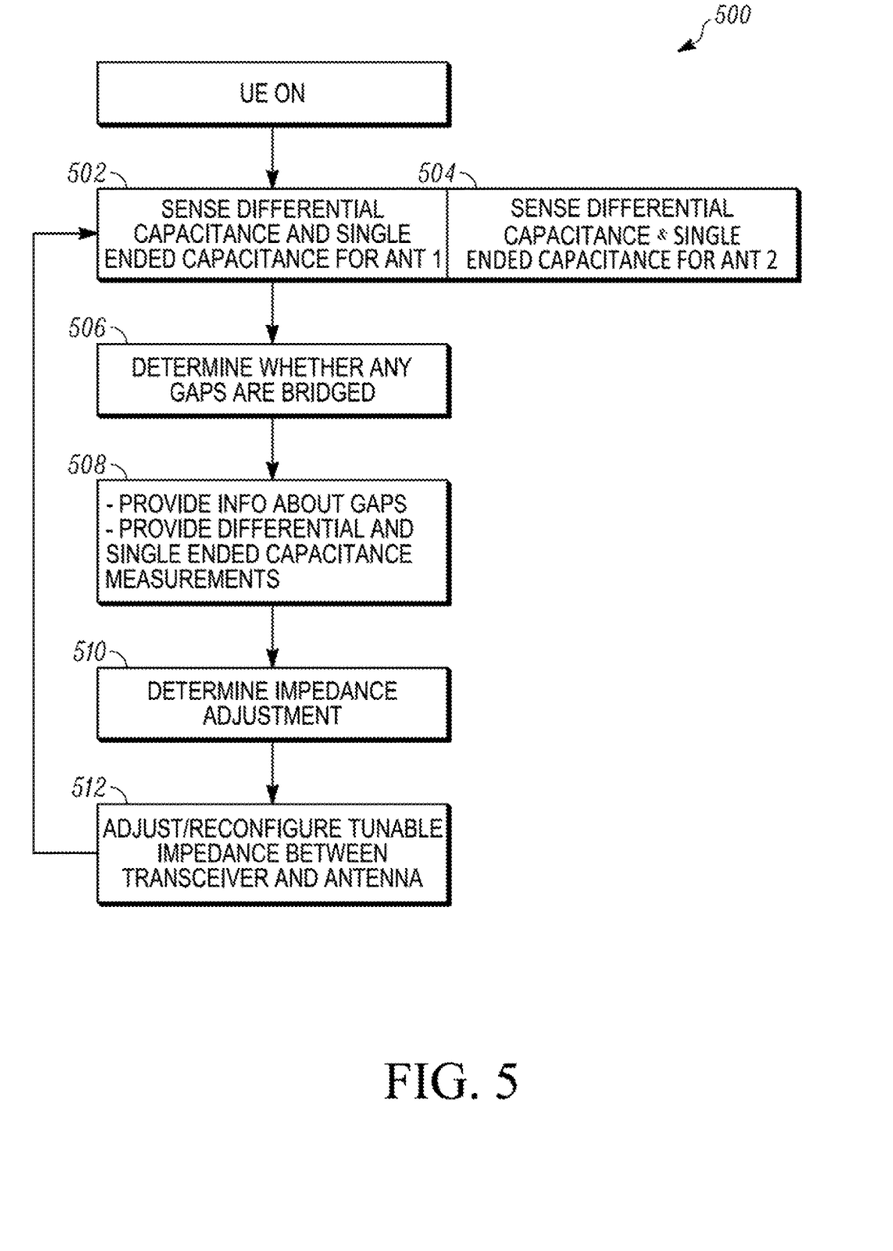
FIG. 5 is a flowchart depicting a method of measuring capacitance associated with an antenna and reconfiguring an antenna impedance matching circuit so as to impedance match the antenna with the transceiver.

Referring now to FIG. 5, a flowchart is provided depicting a method of sensing whether and where a user's, for example, hand is touching the sectioned metal band about the perimeter of a UE. At step 500, the UE is on and operational. When the UE is on it may be transmitting and/or receiving wireless communication signals associated with one or more telecommunication channels and frequencies.

For the top antenna 406, at step 502 the capacitance sensor block 402 senses a first differential capacitance across the first gap 422. The first differential capacitance is sensed between the top antenna 406 and the first metal section 408. Additionally, a third single ended capacitance across the third gap 424 is sensed and measured by the capacitance sensor block 402, which is the capacitance between the first metal section 408 and ground. To simplify this description the discussion will be mainly directed to the first corner or metal section 408 and the first and third gaps 422, 424 on either side thereof. It is further understood that a second differential capacitance is measured across the second gap 426 and a fourth single ended capacitance is measured across the fourth gap 428. Similar measurements are made by embodiments for the gaps associated with both sides of the bottom antenna 412.

At step 506, the capacitance sensor block makes a determination as to whether the first gap 422 and/or the third gap 424 are being bridged by, for example, a user's hand while touching or holding the UE. The first gap 422 is considered bridged when the sensed first differential capacitance is greater than a predetermined differential capacitance threshold. The third gap 424 will be considered bridged when the capacitance sensor block determines that the single ended capacitance across the third gap 424 is greater than a predetermined capacitance threshold. By using a differential capacitance sensor and measuring the differential capacitance across the first gap 422, the differential capacitance can be measured regardless of whether the third gap 424 is bridged or not bridged to ground. Thus, embodiments can accurately determine specifically which one of the gaps on either side of the first metal section 408 is being bridged and the capacitance associated with the bridging of the gap by a user's hand.

At step 508 the capacitance sensor block 402 provides a capacitance sense signal 418 to the matching circuit controller 420. The capacitance sense signal 418, in some embodiments, merely indicates which gap(s), if any, is being bridged by a user's hand. Thus for example, the matching sensor signal may merely indicate that the third gap is being bridged and the first gap is not being bridged. In additional embodiments, not only is an indication of which gap is being bridged provided in the capacitance sense signal, but also the measured differential capacitance and single ended capacitance associated with the particular gap is also provided in the signal.

Thus in general, at step 508, the capacitance sense signal provided to the matching circuit controller includes an indication as to which gap(s) (e.g., gaps one, two, three or four) are bridged or not bridged. And, in some embodiments the capacitance sense signal will further include the respective sensed differential or single ended capacitance measured across each gap.

Referring for a moment back to step 502, it is noted that the sensing of the differential capacitance across the second gap 426 and the single ended capacitance across the fourth gap 428 is similarly measured for the top antenna 406. Thus at step 506, when the measured differential capacitance across the second gap exceeds a predetermined differential capacitance threshold it is determined that the second gap 426 is being bridged by a user's hand. Similarly when the measured single ended capacitance between the second metal section 410 and ground exceeds a predetermined capacitance threshold it is determined that the fourth gap 428 is being bridged.

At step 510, the matching controller circuit 420 determines whether an impedance adjustment between the transceiver and the top antenna 406 is needed based on one or more of the gaps (gaps one, two, three or four) being bridged. Embodiments can detect when simultaneous bridging by a user's hand of, for example, the first gap 422 and the third gap 424 is occurring. Simultaneous bridging of the first gap and the third gap is detected when the differential capacitance measurement across the first gap exceeds the first differential capacitance threshold and the single ended capacitance measurement across the third gap exceeds the third single ended capacitance threshold. When both the first and third gaps are bridged, the antenna will experience a higher capacitive coupling impedance to ground then when only one of the first and third gaps is bridged. The purpose of the metal corner sections being positioned between the antenna and the grounded sections is to add distance between the antenna and the ground plane two thereby decrease the probability that the antenna will be grounded through a user's hand to the ground plane. This is important because when an antenna is capacitively coupled through the impedance of a user's hand to ground, the efficiency of the antenna is decreased.

Still at step 510, the matching controller circuit 420 uses the information provided in the capacitance sensor signal to determine an impedance adjustment necessary to more closely match the impedance between the transceiver and the antenna. In some embodiments, the matching circuit controller 420 may use a lookup table or database stored within a memory of the UE to determine the adjustment needed. In other embodiments, the matching circuit controller may calculate an impedance adjustment based on the communication signal frequency being transmitted or received by the transceiver and the overall impedance load including any additional impedance resulting from bridging of one or more gaps (gaps one, two, three or four) about the first antenna.

Upon determining or calculating the needed impedance adjustment or total impedance that better matches the transceiver with the antenna for the frequency being transmitted or received as well as on the gap bridging or non-bridging position of the user's hand on the UE, the matching controller circuit provides an analog or digital tuning input signal to the tunable antenna matching circuit so as to adjust or reconfigure the tunable impedance provided between the transceiver and the antenna so as to match the impedance between the transceiver and the antenna for a transmitted or received signal.

At step 512, the tunable antenna impedance matching circuit receives the tuning input signal and is configured to use it to adjust or reconfigure the impedance of the tunable antenna matching circuit to match the antenna and RF transceiver impedances for a transmitted or received communication signal. The process then returns to step 502 and repeats while the UE is on.

It may be determined in step 506 that, for example, the first and third gaps are bridged such that there is such a low impedance (resistive impedance) between the antenna and ground that the antenna transmission and/or reception will most likely not produce a viable signal. When this situation occurs, in some embodiments the matching circuit controller 420 will signal the processor 421 with a signal indicating that there is a low impedance between, for example, the antenna 406 and a grounded section of the metal band 404. Upon receipt of the low impedance indicator signal from the matching circuit controller 420, the processor 421 is configured to switch signal transmission or reception from the top antenna 406 to the bottom antenna 412. To switch signal reception from, for example, the top antenna 406 to the bottom antenna 412, the processor 421 is configured to provide a switch reception signal to the RF transceiver 432. The RF transceiver 432, upon receipt of the switch reception signal configures the reception of the signal to be only from the bottom antenna 412 instead of just the top antenna 406, or both the top antenna 406 and the bottom antenna 412.

Embodiments provide external antenna sections positioned on the exterior of the UE that are less susceptible to being bridged to ground due to the UE being touched or held by, for example, the user's hand. Electrically floating metal sections are positioned at either side or end of the antenna sections. These electrically floating metal sections act as parasitic elements to the antenna. Nonconductive gaps exist between the electrically floating metal sections and the antenna. Nonconductive gaps are also in between the electrically floating metal sections and ground. On each side of an antenna section, embodiments provide two gaps between the antenna section and ground so as to reduce the overall capacitance to ground as compared to having a single gap between an end of the antenna and ground. Additionally, two gaps rather than a single gap must be simultaneously bridged by the user's hand in order to greatly impair the antenna efficiency due to a high capacitive coupling between the active antenna and ground. Various embodiments detect if and when both gaps between one side of the antenna and ground are bridged to ground by measuring or sensing a differential capacitance between the antenna and the electrically floating metal section as well as a single ended capacitance between the electrically floating metal section and ground. If both of these measurements exceed a respective capacitance threshold, then it is determined that both of the gaps between one side of the antenna and ground are bridged. Upon sensing a bridging of both of the gaps, embodiments are adapted to reconfigure the impedance of a tunable antenna matching circuit between the UE's transceiver and the antenna in order to more closely impedance match the antenna and the transceiver and compensate for the bridging of the antenna to ground.

Although the preferred embodiment has been described in detail, it should be understood that various changes, substitutions and alterations can be made therein without departing from the spirit and scope of the invention as defined by the appended claims.

What is claimed is:

1. An antenna system comprising:
   a first antenna;
   a first metal section spaced by a first gap from a first end of the first antenna;
   a first ground section spaced by a third gap from the first metal section, the first ground section connected to ground;
   a capacitance sensor configured to measure a first differential capacitance between the first antenna and the first metal section, when the first differential capacitance exceeds a first differential threshold the capacitance sensor provides a capacitance sense signal indicating that the first gap is being bridged by a user's touch; and a matching circuit controller responsive to the capacitance sense signal and configured to provide an impedance control signal to a tunable antenna matching circuit to adjust an impedance between the first antenna and a transceiver based on the first gap being bridged, wherein the tunable antenna matching circuit is connected between the first antenna and the transceiver and wherein the antenna system further comprises a direct current (DC) blocking capacitor between the tunable antenna matching circuit and the first antenna, and wherein the matching circuit controller outputs a tuning signal to a second antenna matching circuit to reconfigure the second antenna matching circuit to impedance match a second antenna.

2. The antenna system of claim 1, wherein the capacitance sensor is further configured to measure a first single ended capacitance between the first metal section and ground, when the first single ended capacitance exceeds a first capacitive threshold the capacitance sense signal provided by the capacitance sensor indicates that the third gap is being bridged by a user's touch and the matching circuit is further configured to provide the impedance control signal to the tunable antenna matching circuit to adjust the impedance between the first antenna and the transceiver based on the third gap being bridged.

3. The antenna system of claim 1, further comprising;
a second metal section spaced by a second gap from a second end of the first antenna; and
a second ground section spaced by a fourth gap from the second metal section, the second ground section connected to ground;
wherein the capacitance sensor is further configured to measure a second differential capacitance between the first antenna and the second metal section, when the second differential capacitance exceeds a second differential threshold the capacitance sense signal provided by the capacitance sensor indicates that the second gap is being bridged by the user's touch and the matching circuit is further configured to provide the impedance control signal to the tunable antenna matching circuit to adjust the impedance between the first antenna and the transceiver based on the second gap being bridged.

4. The antenna system of claim 3, wherein the capacitance sensor is further configured to measure a second single ended capacitance between the second metal section and ground, when the second single ended capacitance exceeds a second capacitive threshold the capacitance sense signal provided by the capacitance sensor indicates that the fourth gap is being bridged by a user's touch and the matching circuit is further configured to provide the impedance control signal to the tunable antenna matching circuit to adjust the impedance between the first antenna and the transceiver based on the fourth gap being bridged.

5. The antenna system of claim 1, wherein the first antenna, the first metal section and the first ground section are part of a sectioned metal band about a perimeter edge of a mobile communication device.

6. The antenna system of claim 1, wherein the DC blocking capacitor having a capacitance greater than a differential capacitance measurement range of the capacitance sensor.

7. The antenna system of claim 6, wherein the DC blocking capacitor has a capacitance between about 20 pF and about 1000 pF.

8. A mobile communication device that is user equipment (UE) comprising:
a first antenna section on an exterior of the UE;
a first metal section spaced from and adjacent to a first end of the first antenna section;
a first ground section spaced from and adjacent to the first metal section such that the first metal section is between the first antenna section and the first ground section, the first ground section being connected to ground;
a capacitance module comprising:
a differential capacitance sensor configured to measure a first differential capacitance between the first antenna section and the first metal section; and
a capacitance sensor configured to measure a first capacitance between the first metal section and ground;
wherein the capacitance module outputs the first differential capacitance and the first capacitance as a capacitance sense signal;
a matching circuit controller configured to use the capacitance sense signal to reconfigure a tunable antenna matching circuit, wherein the antenna matching circuit is connected between a transceiver and the first antenna section, wherein the matching circuit controller outputs a tuning signal to a second antenna matching circuit to reconfigure the second antenna matching circuit to impedance match a second antenna section; and
a direct current (DC) blocking capacitor connected between the tunable antenna matching circuit and the first antenna section.

9. The UE of claim 8, wherein the first antenna section, the first metal section and the first ground section are positioned sequentially as part of a perimeter band attached to and extending about a perimeter surface of the UE.

10. The UE of claim 8, further comprising:
a second metal section space from and adjacent to a second end of the first antenna section; a second ground section spaced from and adjacent to the second metal section such that the second metal section is between the first antenna section and the second ground section, the second ground section being connected to ground;
the capacitance module further comprising:
the differential capacitance sensor further configured to measure a second differential capacitance between the first antenna section and the second metal section; and
the capacitance sensor further configured to measure a second capacitance between the second metal section and ground;
wherein the capacitance module further outputs the second differential capacitance and the second capacitance as part of the capacitance sense signal.

11. The UE of claim 8, wherein the DC blocking capacitor has a capacitance that is greater than a differential capacitance measurement range of the differential capacitance sensor.

12. The UE of claim 8 wherein the first metal section has a floating electrical potential.

13. For a mobile communication device that is user equipment (UE) having an external antenna incorporated about a peripheral surface of the UE, a method of impedance matching at least a first antenna with a transceiver comprising:
measuring, by a differential capacitance sensor, a first differential capacitance between the first antenna and a first metal section, the first metal section being adjacent to a first end of the first antenna, the first metal section and the first antenna having a first gap there between;

measuring, by a capacitance sensor, a first capacitance between the first metal section and a first ground section, the first metal section being adjacent to the first ground section, and first metal section and the first ground section having a third gap there between, the first ground section being connected to ground; and reconfiguring an antenna impedance matching circuit which is connected between the first antenna and the transceiver and where a direct current (DC) blocking capacitor is disposed between the antenna impedance matching circuit and the first antenna so as to impedance match the first antenna with the transceiver based on the combination of the first differential capacitance and the first capacitance, and reconfiguring the antenna impedance matching circuit to output a tuning signal to a second antenna matching circuit to reconfigure the second antenna matching circuit to impedance match a second antenna.

14. The method of claim 13, wherein when the measured first differential capacitance is greater that a differential threshold, the antenna impedance matching circuit is reconfigured for a capacitance associated with a user bridging the first gap between the first antenna and the first metal section.

15. The method of claim 13, wherein when the measured first differential capacitance is greater than a differential capacitance threshold and the measured first capacitance is greater than a capacitive threshold, the antenna impedance matching circuit is reconfigured for a capacitance associated with a user bridging both the first gap and the third gap.

16. The method of claim 13, further comprising:

measuring by the differential capacitance sensor, a second differential capacitance between the first antenna and a second metal section, the second metal section being adjacent to a second end of the first antenna, the second metal section and the first antenna having a second gap there between;

measuring, by the capacitance sensor, a second capacitance between the second metal section and a second ground section, the second metal section being adjacent to the second ground section, the second metal section and the second ground section having a fourth gap there between, the second ground section being connected to ground; and reconfiguring the antenna impedance matching circuit so as to impedance match the first antenna with the transceiver based on the combination of the first differential capacitance, the first capacitance, the second differential capacitance, and the second capacitance.

\* \* \* \* \*